(12) United States Patent
Boyanapalli

(10) Patent No.: US 7,007,223 B2
(45) Date of Patent: Feb. 28, 2006

(54) EFFICIENT METHOD AND APPARATUS FOR LOW LATENCY FORWARD ERROR CORRECTION

(75) Inventor: Vipin S. Boyanapalli, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 601 days.

(21) Appl. No.: 10/187,123

(22) Filed: Jun. 30, 2002

(65) Prior Publication Data

US 2004/0003334 A1    Jan. 1, 2004

(51) Int. Cl.
*H03M 13/03* (2006.01)
(52) U.S. Cl. .................. 714/759; 714/781
(58) Field of Classification Search ............ 714/752, 714/759, 781–784
See application file for complete search history.

(56) References Cited

U.S. PATENT DOCUMENTS

| | | | |
|---|---|---|---|
| 4,397,022 A * | 8/1983 | Weng et al. ............ | 714/783 |
| 5,280,488 A * | 1/1994 | Glover et al. ........... | 714/784 |
| 5,327,441 A * | 7/1994 | Kawazoe et al. ........ | 714/795 |
| 5,384,786 A * | 1/1995 | Dudley et al. .......... | 714/784 |
| 5,444,719 A * | 8/1995 | Cox et al. .............. | 714/784 |
| 5,659,557 A * | 8/1997 | Glover et al. .......... | 714/752 |
| 5,712,861 A * | 1/1998 | Inoue et al. ........... | 714/752 |
| 5,875,200 A * | 2/1999 | Glover et al. .......... | 714/784 |
| 6,195,781 B1 * | 2/2001 | Kosuge ................. | 714/784 |
| 6,327,691 B1 * | 12/2001 | Huang .................. | 714/781 |
| 6,353,842 B1 * | 3/2002 | Rajski et al. .......... | 708/252 |
| 6,851,086 B1 * | 2/2005 | Szymanski ............. | 714/781 |
| 2003/0154440 A1 * | 8/2003 | Fredrickson .......... | 714/784 |
| 2003/0192004 A1 * | 10/2003 | Gopalakrishnan ....... | 714/758 |

FOREIGN PATENT DOCUMENTS

JP       61252706 A   * 11/1986

OTHER PUBLICATIONS

IBM Technical Disclosure Bulletin, Aug. 1, 1973, vol. 16, No. 3, pp. 958-967.*

* cited by examiner

*Primary Examiner*—R. Stephen Dildine
(74) *Attorney, Agent, or Firm*—Blakely, Sokoloff, Taylor & Zafman LLP

(57) ABSTRACT

A method and apparatus for low latency Forward Error Correction (FEC) is described. The low latency FEC can be implemented utilizing shift registers, at least one Linear Feedback Shift Register (LFSR), and a local reference table.

33 Claims, 6 Drawing Sheets

| 5-bit result of XOR of received and generated parity bits | Bit to be flipped in 10 bit information sequence |
|---|---|
| 11010 | 1 |
| 01101 | 2 |
| 11100 | 3 |
| 01110 | 4 |
| 00111 | 5 |
| 11001 | 6 |
| 10110 | 7 |
| 01011 | 8 |
| 11111 | 9 |
| 10101 | 10 |

500

EFFICIENT METHOD AND APPARATUS FOR LOW LATENCY FORWARD ERROR CORRECTION

TECHNICAL FIELD

Embodiments of the invention relate generally to an encoding process and more particularly to a method and apparatus for low latency Forward Error Correction (FEC) utilizing a linear feedback element and a table of predetermined values.

BACKGROUND

Transmission of signals over electric, optic, or wireless and other communication paths has developed significant complexity in the last century. Information is embedded in signals in numerous ways and sent over communications paths that sometimes include elements of electric, optic, and wireless paths in one communication. Depending upon the nature of the communication medium, errors may be introduced into the signal as it propagates through the communication medium. These errors may be generated by deficiencies in the channel, by environmental noise, by equipment malfunction, and by numerous other sources.

Various error detection and or correction techniques have been developed to determine if errors exist and in some cases how to fix them. Some conventional error detection techniques include the calculation and comparison of a checksum, and the use of cyclic redundancy check (CRC). In the checksum method, a transmitted message is accompanied by a numerical value based on a calculation on the number of bits in the message. A receiving station then performs the same calculation on the received message and checks to make sure the numerical value in the transmitted message matches the value calculated by the receiving station. If the values are not the same the receiver can assume that the message has errors. A limitation associated with the conventional use of a checksum for error detection, however, is that it fails to detect the nature of the error, i.e., where the error lies in the received message. Accordingly, such a method does not provide the information necessary to enable the receiver to correct the error.

The cyclic redundancy check (CRC) is a popular method of error detection that is similar to the checksum method, but slightly more advanced. CRC breaks a message into frames and calculates a numerical representation of the frame data. The numerical representation is appended to the frame. Any of a number of calculations/formulae may be used to calculate the CRC value so long as it yields a unique determination of the frame data. In this regard, the use of CRC provides the receiver with frame level resolution of an error in the received message.

A problem with simple error detection schemes is that it only benefits communications by recognizing errors. Once an error is detected, if the receiving device needs the corrupted portion of the communication, it must notify the sender in order to have at least that portion of the communication resent. In error prone or noisy transmission environments this solution is unsatisfactory as the need to resend such information results in too much traffic, especially for shared mediums, and too high of a possibility for continued errors.

Error correction techniques therefore are favored in certain environments. Typically error correction techniques also utilize an error detection mechanism. A common error correction technique is called Forward Error Correction (FEC). FEC, like CRC, appends redundant information in some fashion to corresponding sections of the original information. The difference is that in FEC the redundant information allows for regeneration of the original information, provided certain conditions are met. In this way no request for retransmission is required. Since the information does not have to be retransmitted, the communication throughput will be much higher than a conventional error detection scheme when the error rate in a transmission medium is high. However, a significant problem with conventional error correction techniques such as, e.g., FEC, is that they generally introduce an untenable amount of latency to the communication.

BRIEF DESCRIPTION OF THE DRAWINGS

Embodiments of the invention are illustrated by way of example, and not necessarily by way of limitation in the figures of the accompanying drawings in which like reference numerals refer to similar elements.

DETAILED DESCRIPTION

In the following description numerous specific details are set forth in order to provide a thorough understanding of embodiments of the invention. It will be apparent, however, to one having ordinary skill in the art that the specific detail need not be employed to practice embodiments of the invention. In other instances, well known materials or methods have not been described in detail in order to avoid obscuring the present invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment.

Figure 1:
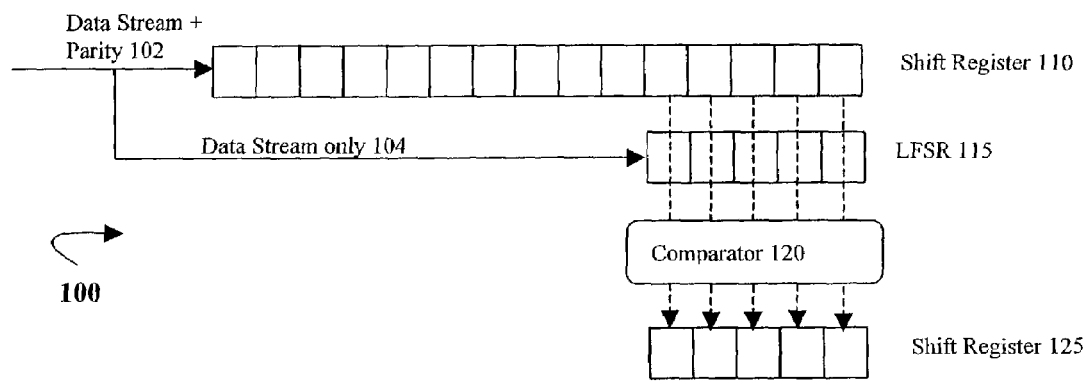
FIG. 1 is an embodiment of a circuit illustrating a low latency forward error correction technique using a linear feedback shift register (LFSR), a comparator circuit and two shift registers.

In FIG. 1, an embodiment of the present invention is disclosed in block diagram 100. As depicted, circuit 100 is generally comprised of shift registers 110 and 125, a linear feedback shift register 115 and a comparator 120, each logically coupled as depicted. It will be understood by one of ordinary skill in the art that the circuitry as shown is for descriptive purposes only, and that other variations for accomplishing the described aspects of the circuitry may be employed without departing from the principles of or exceeding the scope of the present invention.

Specifically, the shift register 110 may be any length. Furthermore the LFSR 115 and shift register 125 need to be an equal length and no longer than the shift register 110. Thus, a bit stream may be parsed into any length segment to run parity on, so long as the length of the shift register 110 equals the length of any segment plus the length of the result of the parity generation, or other redundancy code generation. It will also be understood by one of ordinary skill in the art that the circuitry may be implemented in software.

Turning now to FIG. 1, one embodiment of the present invention shows a data stream including parity 102, is input into shift register 110. The data stream without parity 104 is entered into a LFSR 115 or equivalent and a new parity value is generated. The parity value generated from the LFSR 115 is compared in the comparator 120 with the received parity value. The result of this comparison is placed in shift register 125. In one embodiment the comparator 120 can be an exclusive OR (XOR) comparator or like circuit. It will be understood by one of ordinary skill in the art to use as the comparator 120 any type of circuit that operates on two values in a manner that either compares them or simply operates some mathematical function between the values.

Figure 2:
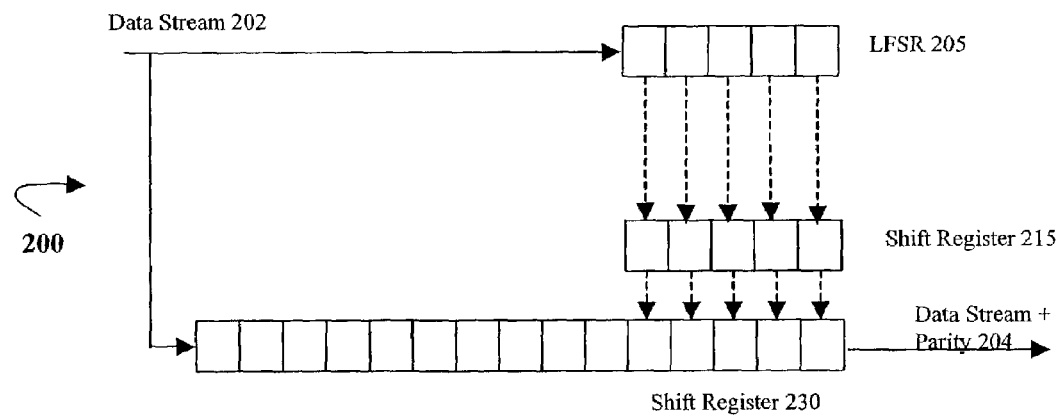
FIG. 2 is an embodiment of a circuit illustrating a low latency forward error correction technique using a linear feedback shift register (LFSR), a comparator circuit and two shift registers.

In FIG. 2 an embodiment of the present invention is disclosed in block diagram 200. As depicted, circuit 200 is generally comprised of shift registers 215 and 230, and a linear feedback shift register 205, each logically coupled as depicted. It will be understood by one of ordinary skill in the art that the circuitry as shown is for descriptive purposes only, and that other variations for accomplishing the described aspects of the circuitry may be employed without departing from the principles of or exceeding the scope of the present invention.

Specifically, the shift register 230 may be any length. Furthermore the LFSR 205 and shift register 215 need to be an equal length and no longer than the shift register 230. Thus, a bit stream may be parsed into any length segment to run parity on, so long as the length of the shift register 230 equals the length of any segment plus the length of the result of the parity generation, or other redundancy code generation. It will also be understood by one of ordinary skill in the art that the circuitry may be implemented in software.

Turning now to FIG. 2, one embodiment of the present invention shows a data stream 202 as an input into a LFSR 205, or equivalent, and a parity value is generated. The parity value generated from the LFSR 205 is entered into shift register 215. The parity value stored in shift register 215 is then entered into shift register 230 and combined with the input data stream 202. The combination of data stream and parity 204 is output from circuit 200.

Figure 3:
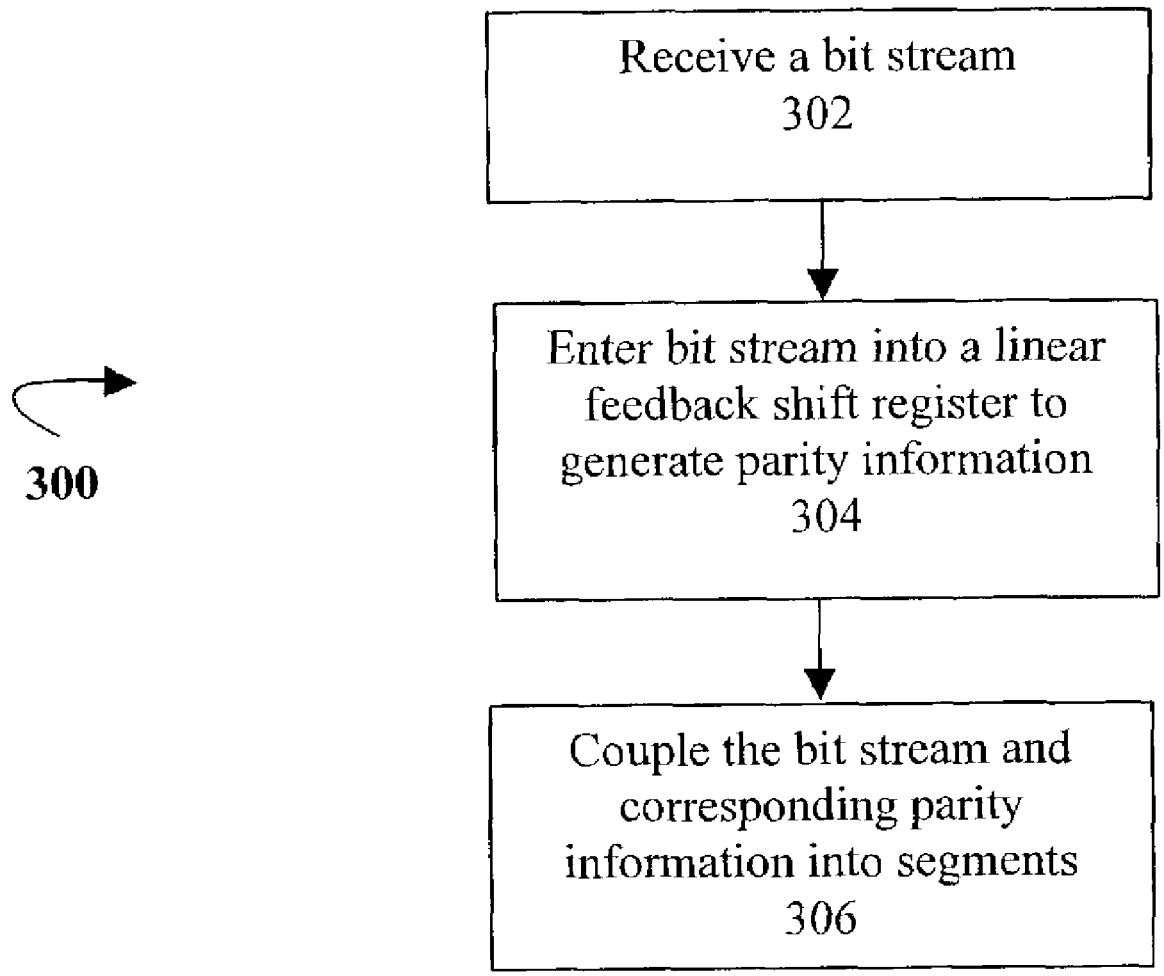
FIG. 3 is a flowchart illustrating one embodiment of a method for generating low latency forward error correction using a linear feedback shift register.

FIG. 3 is a flowchart illustrating an embodiment of the invention. It will be understood by one of ordinary skill in the art how to create other flowcharts illustrating how to implement other embodiments of the present invention that enable use of low latency FEC using a LFSR. The particular methods of one embodiment of the invention are described in terms of computer software with reference to a flowchart 300. The methods to be performed by a computer constitute computer programs made up of computer-executable instructions.

Describing the methods by reference to a flow diagram enables one skilled in the art to develop such programs including such instructions to carry out the methods on suitably configured computers (i.e., the processor or processors of the computer executing the instructions from computer-accessible media). The computer-executable instructions may be written in a computer programming language or may be embodied in firmware logic. If written in a programming language conforming to a recognized standard, such instructions can be executed on a variety of hardware platforms and for interface to a variety of operating systems or without an operating system.

Turning now to FIG. 3, at block 302 circuit 200 receives a bit stream. At block 304, circuit 200 enters the bit stream into a linear feedback shift register, or equivalent circuitry or instructions, to generate parity information. At block 306, the circuit 200 couples the bit stream and corresponding parity information into segments.

Figure 4:
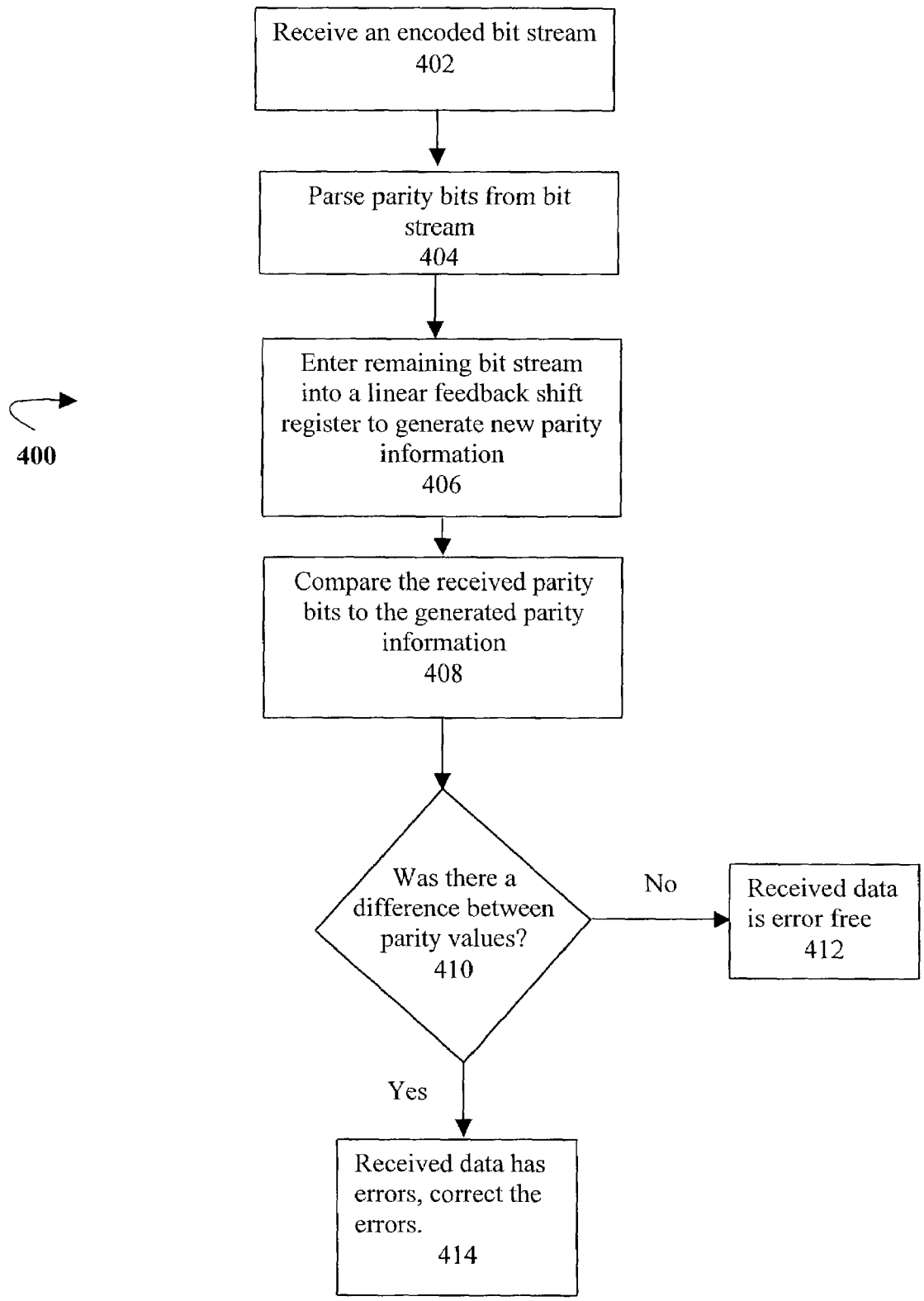
FIG. 4 is a flowchart illustrating one embodiment of a method for low latency forward error correction using a linear feedback shift register.

In FIG. 4, circuit 100, or equivalent circuits or software, receives an encoded bit stream in block 402. In block 404, circuit 100 parses parity bits from the bit stream. Block 406 shows circuit 100 entering the remaining bit stream, after the parity bits from block 404 are parsed, into a linear feedback shift register 115, or equivalent, to generate new parity information. At block 408, the received parity bits are compared to the generated parity bits. In block 410, if there was no difference between the two parity values, the flowchart displays in block 412 that the received data is error free. If, in block 410, a difference in the parity values was detected, the received data includes errors as displayed in block 414.

Figure 5:
FIG. 5 is an illustration of one embodiment of a reference table relating the parity comparison to certain segments of the bit stream that need to be changed.

In FIG. 5 an embodiment showing a reference table 500 is shown. It will be understood by one of ordinary skill in the art that the reference table as shown is for descriptive purposes only, and that other variations for accomplishing the described aspects of an embodiment of the invention may be employed without departing from the principles of or exceeding the scope of the present invention.

Specifically, one embodiment may be a lookup table, but any suitable means of storing parity comparison values and corresponding segments of code in the bit stream that need to be changed can be used as an embodiment. Furthermore, the values illustrated in the reference table 500 embodiment of FIG. 5 are for illustrative purposes only and will differ depending upon the parity size or the parity comparison or mathematical combination as shown in the comparator 120 of FIG. 1.

Figure 6:
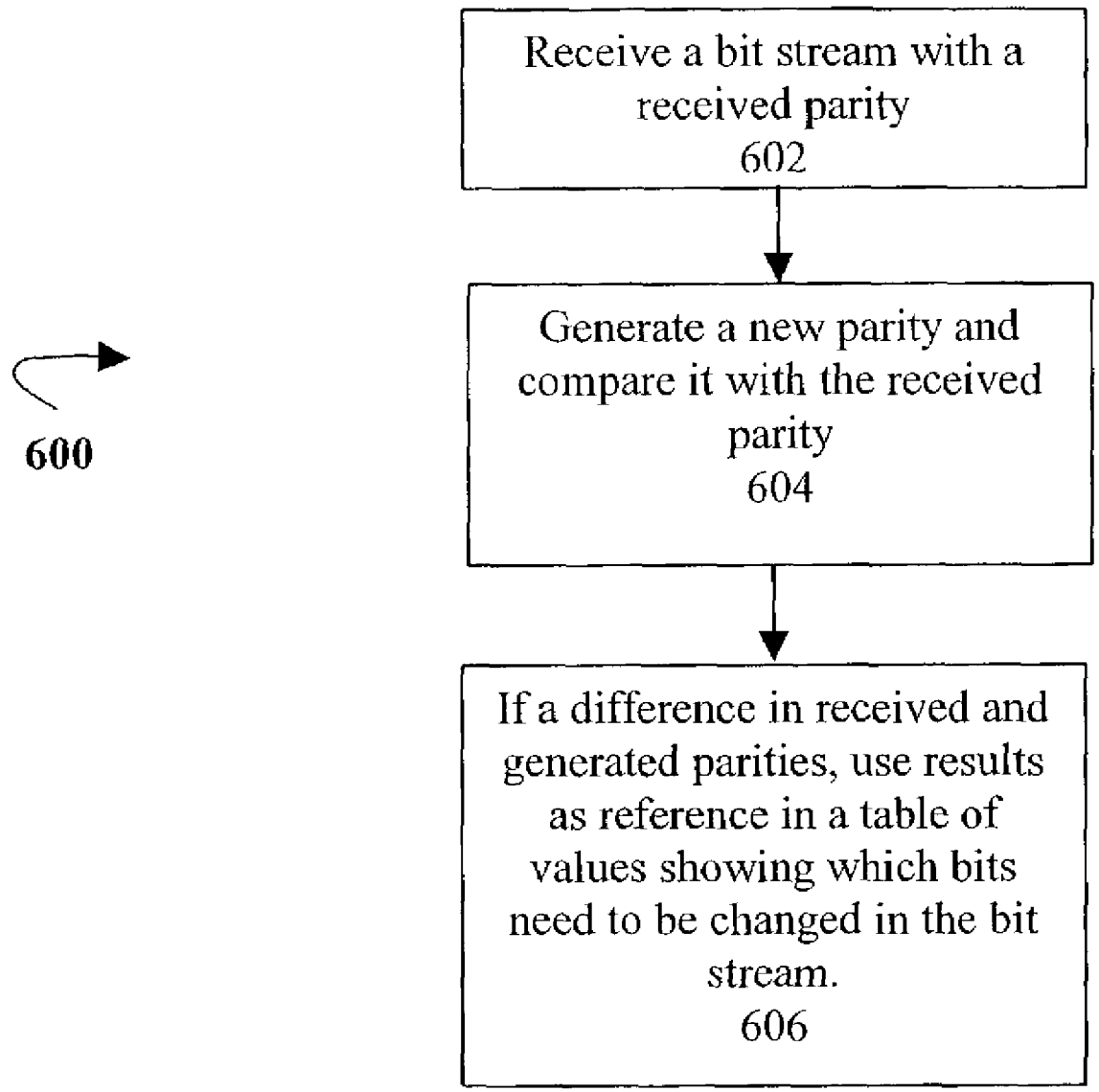
FIG. 6 is a flowchart illustrating one embodiment of a method for low latency forward error correction using a lookup table.

FIG. 6 is a flowchart illustrating an embodiment of the invention. It will be understood by one of ordinary skill in the art how to create other flowcharts illustrating how to implement other embodiments of the present invention that enable use of low latency FEC using a reference table. The particular methods of one embodiment of the invention are described in terms of computer software with reference to a flowchart 600. The methods to be performed by a computer constitute computer programs made up of computer-executable instructions.

Turning now to FIG. 6, in block 602 a circuit 100 receives a bit stream with a received parity embedded in the bit stream. Circuit 100 generates a new parity for the non parity values in the bit stream and compares the new parity to the received parity in block 604. In block 606, if a difference in the generated parity and the received parity is determined, the output of shift register 125 in circuit 100 is compared with a reference table such as reference table 500, and the bits that need to be changed in the bit stream are determined and can thus be corrected.

Figure 7:
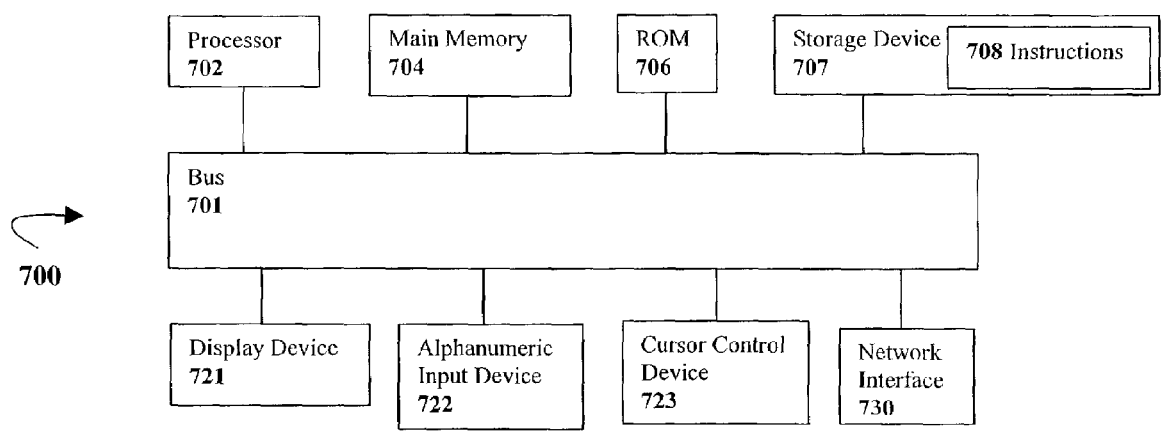
FIG. 7 is an illustration of one embodiment of a computing system capable of low latency forward error correction.

FIG. 7 is a block diagram of an electronic device or appliance 700. As used herein, embodiment 700 may be a computing system, a networking device, or other computing system that operates as a router, server or hub or any other node in a computer network exchanging signals between any other network elements. The computer system illustrated in FIG. 7 is intended to represent a range of computer systems. Alternative computer systems can include more, fewer and/or different components.

Computer system 700 includes bus 701 or other communication device to communicate or transmit information, and processor 702 coupled to bus 701 to process information. Processor 702 may include semiconducting processors generally, application specific integrated circuit (ASICs), a programmable logic device (PLDs), field programmable gate array (FPGAs), digital signal processors DSPs, embedded processors, chipsets, or any other processing device. While computer system 700 is illustrated with a single processor, computer system 700 can include multiple processors and/or co-processors. Computer system 700 further includes random access memory (RAM) or other dynamic storage device 704 (referred to as main memory), coupled to bus 701 to store information and instructions to be executed by processor 702. Main memory 704 also can be used to store temporary variables or other intermediate information during execution of instructions by processor 702.

Computer system 700 also includes read only memory (ROM) and/or other static storage device 706 coupled to bus 701 to store static information and instructions for processor 702. Data storage device 707 is coupled to bus 701 to store information and instructions. Data storage device 707 such as a magnetic disk or optical disc and corresponding drive can be coupled to computer system 700.

Computer system 700 can also be coupled via bus 701 to display device 721, such as a cathode ray tube (CRT) or liquid crystal display (LCD), to display information to a computer user. Alphanumeric input device 722, including alphanumeric and other keys, is typically coupled to bus 701 to communicate information and command selections to processor 702. Another type of user input device is cursor control 723, such as a mouse, a trackball, or cursor direction keys to communicate direction information and command selections to processor 702 and to control cursor movement on display 721. Computer system 700 further includes network interface 730 to provide access to a network, such as a local area network.

Instructions are provided to memory from a storage device, such as magnetic disk, a read-only memory (ROM) integrated circuit, CD-ROM, DVD, via a remote connection (e.g., over a network via network interface 730) that is either wired or wireless, etc. In alternative embodiments, hardwired circuitry can be used in place of or in combination with software instructions to implement embodiments of the invention. Thus, the present invention is not limited to any specific combination of hardware circuitry and software instructions.

The apparatus may be specially constructed for the required purposes, or may comprise a general-purpose computer selectively activated or reconfigured by a computer program stored in a computer. Such a computer program may be stored in a machine-readable storage medium, such as, but not limited to, any type of magnetic or other disk storage media including floppy disks, optical storage media, CD-ROMs, and magnetic-optical disks, read-only memories (ROMs), random access memories (RAMs), EPROMs, EEPROMs, Flash memory, magnetic or optical cards; electrical, optical, acoustical or other form of propagated signals (e.g., carrier waves, infrared signals, digital signals, etc.), or any type of media suitable for storing electronic instructions, and each coupled to a computer system bus.

In one embodiment a storage medium 707 including executable content or instructions 708 is coupled with control logic in the processor 702 to selectively access and execute the content 708 to implement low latency FEC in the manner herein described. It will be understood by one of ordinary skill in the art how to configure an FEC circuit as described herein or program to implement the creation of FEC in the manner herein described that benefits from the low latency allowed by an LFSR, a lookup table, or similar elements.

The foregoing detailed description and accompanying drawings are only illustrative and not restrictive. They have been provided primarily for a clear and comprehensive understanding of the present invention and no unnecessary limitations are to be understood therefrom. Numerous additions, deletions, and modifications to the embodiments described herein, as well as alternative arrangements, may be devised by those skilled in the art without departing from the spirit of the present invention and the scope of the appended claims.

What is claimed is:

1. A method for generating low latency Forward Error Correction (FEC) comprising:
   receiving a bit stream by a first register;
   entering a portion of the bit stream into a Linear Feedback Shift Register (LFSR),
   generating parity bits from the entered portion of the bit stream;
   combining a remaining portion of the bit stream and generated parity bits into a segment and entering the segment into a second register; and
   comparing the segment with predetermined stored values in a table, wherein a unique bit is changed in the portion of the bit stream if a match is made in the comparing.

2. The method of claim 1 further comprising:
   storing a table of predetermined values corresponding to different parity values, said predetermined values corresponding to bits in the bit stream.

3. The method of claim 2 further comprising: storing the table of predetermined values in a lookup table.

4. The method of claim 1 further comprising: partitioning the bit stream in 10 bit segments.

5. The method of claim 4 wherein the generated parity bits have values that are 5 bit values.

6. A circuit for generating low latency Forward Error Correction (FEC) comprising:
   a linear feedback shift register (LFSR) to receive a portion of a bit stream;
   a first shift register coupled with the LFSR to receive the bit stream and output the portion of the bit stream to the LFSR; and
   a second shift register coupled with the LFSR to receive output from the LFSR in combination with a remaining portion of the bit stream.

7. The circuit of claim 6 wherein the received portion of the bit stream is a 10 bit data stream.

8. The circuit of claim 7 wherein the second shift register is a 5 bit register.

9. The circuit of claim 8 wherein the first shift register is a 15 bit register.

10. The circuit of claim 9 wherein a result of the combination of the output from the LFSR and the remaining portion of the bit stream is a FEC 2/3 data stream.

11. A circuit for generating low latency Forward Error Correction (FEC) comprising:
    a linear feedback shift register (LFSR) to receive a portion of a bit stream;
    a first shift register coupled with the LFSR to receive an output from the LFSR; and a second shift register coupled with the LFSR to receive a combination of the output from the LFSR and remaining portion of the bit stream.

12. The circuit of claim 11 wherein the received portion of the bit stream is a 10 bit data stream.

13. The circuit of claim 12 wherein the first shift register is a 5 bit register.

14. The circuit of claim 13 wherein the second shift register is a 15 bit register.

15. The circuit of claim 14 wherein a result of the combination of the output from the LFSR and the remaining portion of the bit stream is a FEC 2/3 data stream.

16. A method for decoding low latency Forward Error Correction (FEC) comprising:
receiving a bit stream in a first register;
parsing parity bits from the bit stream;
entering a portion of the bit stream into a linear feedback shift register (LFSR);
generating new parity bits from the portion of the bit stream;
combining the portion of the bit stream with the new parity bits into a second register;
comparing a result of the combining the portion of the bit stream with the new parity bits with a plurality of predetermined values to detect match; and
changing a bit in the portion of the bit stream based on the match.

17. The method of claim 16, said comparing further including determining a value for a difference.

18. The method of claim 17 further comprising: storing a table of predetermined values corresponding to different parity values, said table of predetermined values corresponding to bits in the bit stream.

19. A circuit for decoding low latency Forward Error Correction (FEC) comprising:
a first shift register to receive a bit stream including parity bits and data bits;
a linear feedback shift register (LFSR) to receive the data bits without the parity bits, the LFSR to generate new parity bits for the data bits;
a first comparator circuit coupled to the LFSR and the first shift register, the first comparator to compare the parity bits to the new parity bits; and
a second comparator circuit to compare output of the first comparator circuit with a table of predetermined values that correspond to different parity values.

20. The circuit of claim 19 wherein said predetermined values to correspond to bits in the bit stream.

21. The circuit of claim 20 wherein the second comparator to determine which corresponding bits in the bit stream are to be changed.

22. A physical machine-readable medium containing instructions that, when executed, cause a machine to:
receive a bit stream including parity bits and data bits in a first register;
enter a portion of the bit stream into a Linear Feedback Shift Register (LFSR);
generate new parity bits;
combine the data bits and new parity bits into a second register;
compare a result of the combined data bits and new parity bits with a plurality of predetermined values;
generate low latency Forward Error Correction (FEC) by changing a bit in the data bits based on a match from the compare.

23. The physical machine-readable medium of claim 22 further comprising instructions that cause the machine to store a table of predetermined values corresponding to different parity values, said predetermined values corresponding to bits in the bit stream.

24. The physical machine-readable medium of claim 23, further containing instructions to cause the machine to store the table of predetermined values in a lookup table.

25. The physical machine-readable medium of claim 22, wherein the bit stream is partitioned in 10 bit segments.

26. The physical machine-readable medium of claim 25, wherein the parity values are 5 bit values.

27. A physical machine-readable medium containing instructions that, when executed, cause a machine to:
receive a bit stream by a first register;
parse received parity bits from the bit stream;
enter the remaining bit stream into a linear feedback shift register (LFSR) to generate new parity bits;
compare the received parity bits to the generated new parity bits to detect any difference; and
change a bit in the bit stream based on a result of the compare.

28. The physical machine-readable medium of claim 27, wherein any detected difference is a determined value.

29. The physical machine-readable medium of claim 28, further containing instructions that cause the machine to:
store a table of predetermined values corresponding to different parity values, said predetermined values corresponding to bits in the bit stream.

30. The physical machine-readable medium of claim 29, further containing instructions that cause the machine to:
compare the determined value and the predetermined values, and
change the corresponding bits in the bit stream.

31. A computing appliance comprising:
a storage medium including executable content, the storage medium to receive a bit stream;
a control logic, coupled with the storage medium to selectively access and execute the content to generate a low latency Forward Error Correction (FEC) in a linear feedback manner, the control logic to receive output from a linear feedback shift register (LFSR), and to combine the output with a portion of the bit stream into a second register.

32. The computing system according to claim 31, further comprising an input port, to
receive a bit stream from a network device.

33. The computing appliance according to claim 32 further comprising an output port,
coupled to a network device, to send the Forward Error Corrected bit stream to the network device.

* * * * *